United States Patent [19]

Hause et al.

[11] Patent Number: 5,843,625

[45] Date of Patent: Dec. 1, 1998

[54] METHOD OF REDUCING VIA AND CONTACT DIMENSIONS BEYOND PHOTOLITHOGRAPHY EQUIPMENT LIMITS

[75] Inventors: Fred N. Hause, Austin; Mark I. Gardner, Cedar Creek; Robert Dawson, Austin, all of Tex.

[73] Assignee: Advanced Micro Devices, Inc.

[21] Appl. No.: 685,144

[22] Filed: Jul. 23, 1996

[51] Int. Cl.⁶ ...................................................... G03F 7/00
[52] U.S. Cl. ........................... 430/313; 430/317; 430/267
[58] Field of Search ..................................... 430/311, 313, 430/316, 317; 438/267

[56] References Cited

U.S. PATENT DOCUMENTS 5,254,213  10/1993  Tamaki ..................................... 156/655
5,294,296   3/1994  Yoon et al. .............................. 156/657
5,381,040   1/1995  Sun et al. ................................ 257/774

FOREIGN PATENT DOCUMENTS 0 469 214 A1  7/1990  European Pat. Off. .
0 720 211     7/1996  European Pat. Off. .

OTHER PUBLICATIONS

Patent Abstracts of Japan, vol. 012, No. 054, Feb. 18, 1988 & JP 62 200731, Sep. 4, 1987.
Shih Wei Sun et al., "A Polysilicon Hard–Mask/Spacer Process for Sub–.05 Micron ULSI Contacts," Journal of the Electrochemical Society, vol. 138, No. 2, Feb. 1, 1991, pp. 619–620.
International Search Report for PCT/US 97/08817 dated Sep. 16, 1997.

Wolf, Stanley, Ph.D., *Silicon Processing for the VLSI Era, vol. 3: The Submicron Mosfet*, 1995 by Lattice Press, pp. 595–598.

*Primary Examiner*—Kathleen Duda
*Attorney, Agent, or Firm*—Kevin L. Daffer; Conley, Rose & Tayon

[57] ABSTRACT

A semiconductor process for forming an interlevel contact. A semiconductor wafer is provided with a semiconductor substrate, a first conductive layer formed on the substrate, and a dielectric layer formed on the conductive layer. A border layer, preferably comprising polysilicon or silicon nitride is formed on the dielectric layer. Portions of the border layer are then selectively removed to expose an upper surface of a spacer region of the dielectric layer, the selective removal of the border layer resulting in a border layer having an annular sidewall extending upward from the dielectric layer and encircling the spacer region. A spacer structure is then formed on the annular sidewall. Preferably, the spacer structure is formed by chemically vapor depositing a spacer material and anisotropically etching the spacer material to just clear in the planar regions with minimum overetch. The spacer structure thereby covers peripheral portions of the spacer region such that an upper surface of a contact region remains exposed. Portions of the dielectric layer within the contact region are then removed to form a via extending from an upper surface of the spacer structure to an upper surface of the first conductive layer. Preferably, the lateral dimension of the spacer region is approximately equal to the minimum feature size of a photolithography exposure apparatus in the lateral dimension of the via at substantially less than the minimum feature size of the photolithography exposure apparatus.

15 Claims, 4 Drawing Sheets

METHOD OF REDUCING VIA AND CONTACT DIMENSIONS BEYOND PHOTOLITHOGRAPHY EQUIPMENT LIMITS

BACKGROUND OF THE INVENTION

1. Field of the Invention

This invention relates to the field of semiconductor processing and, more particularly, to a method of forming a via having a lateral dimension (diameter) less than the minimum resolvable feature size of the photolithography exposure device using non-oxide spacers.

2. Description of the Relevant Art

An integrated circuit includes a large number of transistors formed into a monolithic semiconductor substrate, typically comprising silicon. Isolation structures such as field oxides or shallow trench dielectrics are used to electrically isolate each individual transistor. Individual transistors are thereafter selectively coupled to other transistors to achieve a desired function. In many processes, the selective coupling or interconnecting of individual transistors is accomplished by depositing an insulating material such as a dielectric upon the wafer, forming via structures in desired locations through the use of conventional photolithography and etch techniques, and forming a conductive layer on the upper surface of the insulating material. The conductive layer will fill the via and can be patterned to selectively couple specified transistor terminals to achieve the desired function. This process of forming a conductive layer on an insulating layer containing a plurality of via is commonly repeated such that the device contains multiple interconnect levels and multiple interlevel dielectric layers. Multiple level interconnects enable greater functional complexity and can reduce the average length of the interconnects thereby minimizing the RC delay imposed by the interconnects. The lateral dimension of the via is typically smaller than the lateral dimension of the interconnects to ensure that the via opening does not overlap or extend via on the interconnect line. If the via opening is larger than the interconnect, the via etch process may proceed through the dielectric layer upon which the interconnect is formed. This is typically an undesirable result. Thus, as interconnect critical dimensions drop below the sub-0.5 micron region, the critical dimensions of the via must shrink to even smaller dimensions.

The main limitation of minimum feature size in a semiconductor process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleigh's criteria define two images as being resolvable when the intensity between them drops to 80% of the image intensity. These criteria are satisfied when the $2d=0.61\lambda/NA$, where $2d$ is the separation distance of two images, $\lambda$ is the wavelength of the energy source, and NA is the numerical aperture of the lens.

Commercially available optical photolithography machines are almost universally equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~450 nm is designated the "G-line," the ~405 nm peak the "H-line," and the ~365 nm peak the "I-line." Photolithography aligners are similarly designated such that it is common to speak of "G-line aligners." The minimum feature size resolvable by a G-line aligner is greater than the minimum feature size resolvable by an I-line aligner because of the longer G-line wavelength. In addition, "deep UV" aligners utilize energy having wavelengths of 248 nm and 193 nm to achieve better resolution than is achievable with I-line aligners.

As process technologies approach and surpass the resolvable limits of optical aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line aligners. To adequately resolve features in the submicron range, it is typically necessary to upgrade these aligners so that they can operate in the I-line region. Similarly, fabrication facilities with extensive investment in I-line aligners will eventually need to upgrade to deep UV aligners or abandon the optical alignment equipment entirely and replace it with advanced lithography equipment including e-beam or x-ray lithography. The cost associated with replacing or upgrading G-line and I-line photolithography equipment can be staggering. In addition to the capital required to purchase and install the improved equipment, there are extensive costs associated with qualifying the new equipment for production worthiness and training production and maintenance personnel in the operation and care of the new equipment. Similarly, in fabrication facilities that have an extensive investment in I-line aligners, the cost of abandoning these aligners to achieve smaller feature sizes is tremendous. Therefore, it is highly desirable to implement a manufacturing process that can extend the useful life of existing photolithography equipment by permitting the reproducible fabrication of via having critical dimensions that are smaller than the minimum resolvable feature of the photolithography equipment.

SUMMARY OF THE INVENTION

The problems noted above are in large part addressed by a method of fabricating via and contacts in which spacer structures are used to reduce the dimension of a critical feature below the minimum feature size resolvable by the photolithography equipment. Specifically, the photolithography equipment is used to define a spacer region in a border layer formed on the surface of a dielectric layer. The portion of the border layer within the spacer region is then removed, suitably with a dry etch process. In a preferred embodiment, the lateral dimension of the spacer region is approximately equal to the minimum feature size resolvable by the photolithography equipment.

After the spacer region is defined in the border layer, a spacer structure is formed on the annular sidewall of the border layer such that a contact region of the dielectric substrate remains exposed. Preferably, the contact region has a lateral dimension which is less than the minimum feature size of the photolithography equipment. Thereafter, the portion of the dielectric layer within the contact region is removed, preferably with a dry etch process, to form a via extending from an upper surface of the dielectric layer to an upper surface of a first conductive layer formed beneath the dielectric layer. By selectively controlling the dimension of the spacer structures, the improved method hereof reduces the lateral dimension of the via below the minimum dimension resolvable by the photolithography equipment.

Broadly speaking, the present invention contemplates a semiconductor process for forming an interlevel contact. A semiconductor wafer is provided. The wafer comprises a semiconductor substrate, a first conductive layer formed on the semiconductor substrate, and an interlevel dielectric layer formed on the first conductive layer. A border layer, preferably comprising oxide, polysilicon, or silicon nitride, is formed on the interlevel dielectric layer. Portions of the border layer are then selectively removed to expose an upper surface of a spacer region of the dielectric layer. A spacer structure is then formed on the annular sidewall of the border layer. In one embodiment, the spacer structure comprises a conductive material such as tungsten or heavily doped polysilcion. In alternative embodiments, the spacer structure may comprise oxide, undoped polysilicon, or silicon nitride. The spacer structure covers peripheral portions of the spacer region such that an upper surface of a contact region of the dielectric layer remains exposed. The portions of the dielectric layer within the contact region are then removed to form a via extending from an upper surface of the dielectric layer to an upper surface of the first conductive layer.

In a preferred embodiment, selective removal of portions of the border layer includes depositing a photoresist layer on the border layer. The photoresist layer is then patterned with a photolithography exposure apparatus capable of resolving a minimum feature dimension in the photoresist layer. The photoresist layer is patterned such that a spacer region, having a lateral dimension approximately equal to the minimum feature dimension of the border layer, is exposed. The exposed portions of the border layer are then removed to expose the dielectric layer within the spacer region. Removal of portions of the border layer results in a border layer having an annular sidewall extending from an upper surface of the dielectric layer at lateral boundaries of the spacer region. Preferably, the spacer structures are formed by chemically vapor depositing a spacer material on a topography cooperatively defined by the border layer and the interlevel dielectric layer. Thereafter the spacer material is anisotropically etched to clear the spacer material from planar regions of the topography.

In a preferred embodiment, the present invention further comprises the steps of blanket depositing an adhesion layer, blanket depositing a plug material to fill the via, and removing portions of the adhesion layer and the plug material from regions exterior to the via. Thereafter, a second conductive layer is formed on the topography defined by the upper surfaces of the border layer, the spacer structure, and the plug material.

The present invention further contemplates an interlevel contact structure in a semiconductor device. The contact structure comprises a first conductive layer formed on an upper surface of a semiconductor substrate. A conductive plug extends from an upper surface of the first conductive layer. A dielectric layer formed on the first conductive layer encircles a base portion of the conductive plug while a spacer structure, formed on peripheral portions of a spacer region of the dielectric layer, encircles an upper portion of the conductive plug. A border layer formed on the dielectric layer encircles the spacer structure. In a preferred embodiment, the first conductive layer comprises a material selected from the group consisting of aluminum, tungsten, copper, and heavily doped polysilicon. The conductive plug suitably comprises aluminum, tungsten, or copper. In a presently preferred embodiment, the conductive plug includes an annular outer shell comprising titanium, titanium-tungsten, titanium nitride, or tungsten. In a preferred embodiment, the lateral dimension of the conductive plug is approximately 100 nm, the border layer is approximately 50–150 nm thick, and the spacer structure has a lateral dimension of approximately 200 nm. The border layer preferably comprises oxide, silicon nitride, or polysilicon while the spacer structure preferably comprises a conductive material such as tungsten or heavily doped polysilicon. Alternatively, the spacer structure may comprise oxide, undoped polysilicon, or silicon nitride.

The present invention still further contemplates a semiconductor process for forming a via. A semiconductor wafer, including an interlevel dielectric layer formed on a first conductive layer formed on a semiconductor substrate, is provided. A border layer is formed on the interlevel dielectric layer and a photoresist layer is deposited on the border layer. Thereafter, a photolithography exposure apparatus is provided where the exposure apparatus is capable of resolving a minimum feature dimension in the photoresist layer. The photoresist layer is then patterned with the photoresist exposure device to expose a spacer region of the border layer. The spacer region of the border layer has a lateral dimension approximately equal to the minimum feature dimension of the photolithography exposure apparatus. The portions of the border layer within the spacer region are then removed to expose an upper surface of the dielectric layer such that the border layer includes an annular sidewall extending from an upper surface of the dielectric layer at lateral boundaries of the spacer region. A spacer structure is then formed on the annular sidewall of the border layer. The spacer structure covers peripheral portions of the spacer region such that an upper surface of a contact region of the dielectric layer remains exposed. The contact region has a lateral dimension less than the minimum feature dimension of the photolithography exposure apparatus. The portions of the dielectric layer within the contact region are then removed to form a via having a lateral dimension which is less than the minimum feature size of the photolithography exposure apparatus. The via extends from an upper surface of the dielectric layer to an upper surface of the first conductive layer. In a preferred embodiment, the photolithography exposure apparatus is an I-line aligner and the minimum feature dimension is approximately 0.5 micron.

BRIEF DESCRIPTION OF THE DRAWINGS

Other objects and advantages of the invention will become apparent upon reading the following detailed description and upon reference to the accompanying drawings in which.

Figure 1:
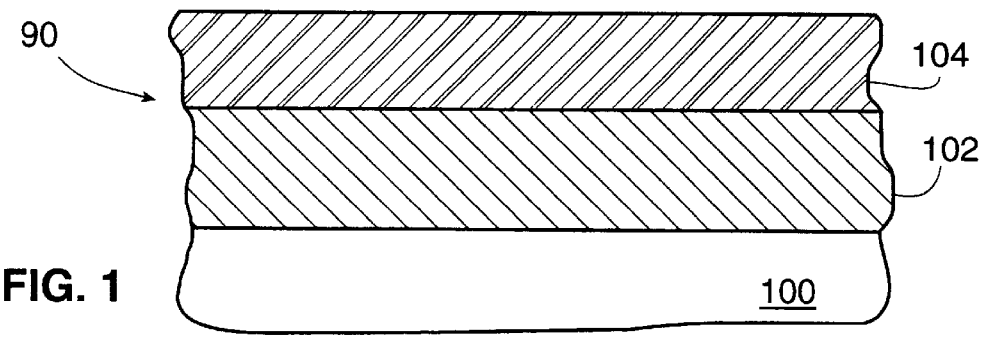
FIG. 1 is a partial cross-sectional view of a semiconductor wafer including a semiconductor substrate, a first conductive layer, and an interlevel dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 6:
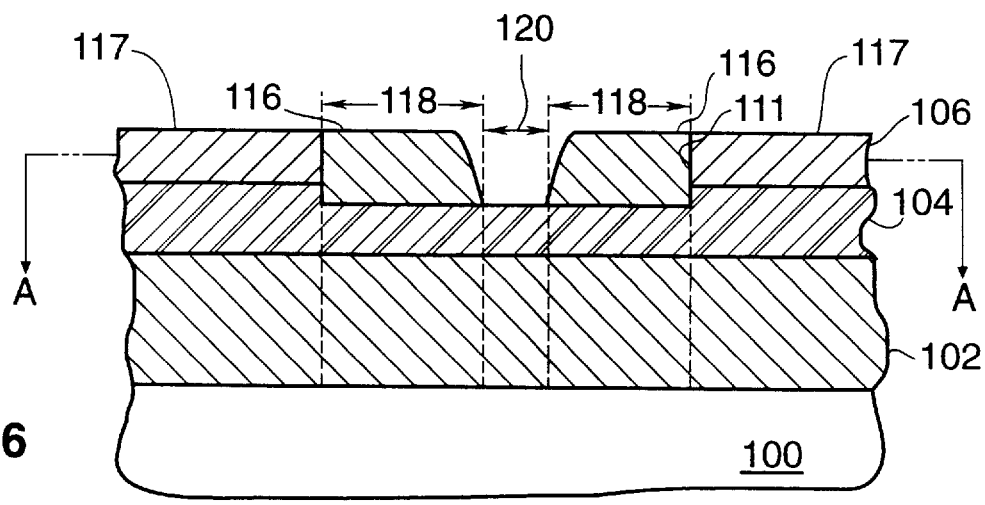
FIG. 6 depicts a processing step subsequent to FIG. 5 in which the spacer material has been anisotropically etched to form a spacer structure on peripheral portions of the spacer region.
Figure 7:
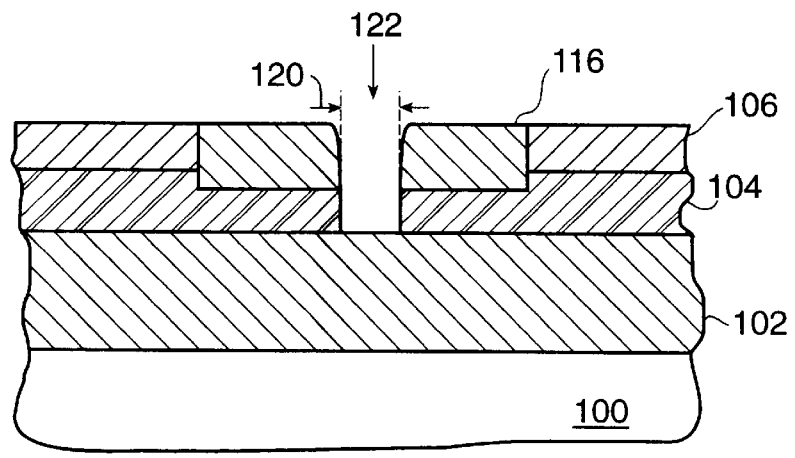
FIG. 7 depicts a processing step subsequent to FIG. 6 in which a via has been formed by removing the portions of the dielectric layer within a contact region.
Figure 8:
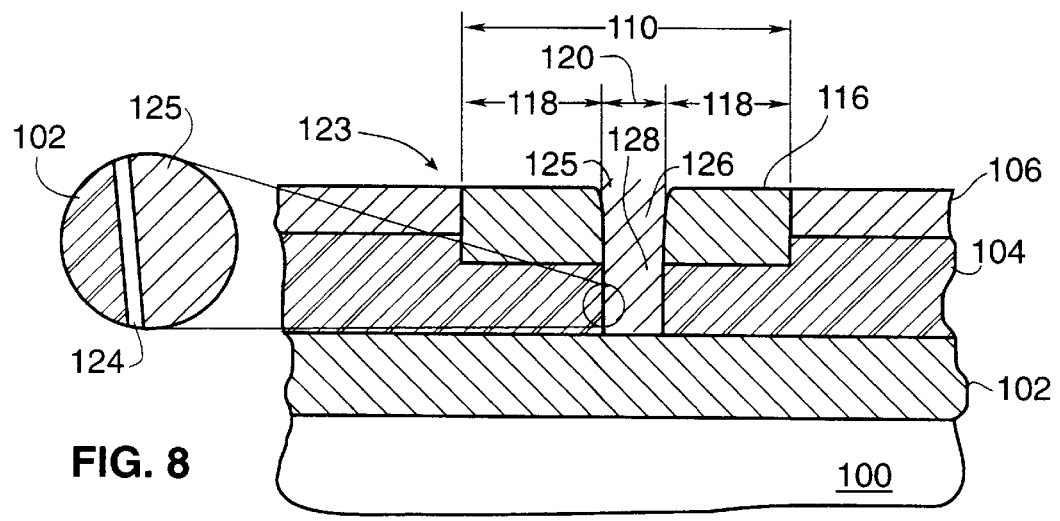
FIG. 8 depicts a processing step subsequent to FIG. 7 in which the via has been filled with a conductive plug.

Turning now to the drawings, FIGS. 1–9 show a semiconductor process sequence for forming a via and corresponding conductive plug having lateral dimensions less than the minimum feature size of a photolithography exposure apparatus used in the process. Turning briefly to FIG. 8, interlevel contact structure 123 is shown. First conductive layer 102 is formed on an upper surface of semiconductor substrate 100. Conductive plug 125 extends from an upper surface of first conductive layer 102. Interlevel dielectric layer 104 is formed on first conductive layer 102 encircling base portion 128 of conductive plug 125. Spacer structure 116 resides on peripheral portions 118 of spacer region 110 of interlevel dielectric layer 104. Spacer structure 116 encircles upper portion 126 of conductive plug 125. Border layer 106 is formed on interlevel dielectric layer 104 encircling spacer structure 116. In a preferred embodiment, conductive plug 125 includes an annular outer shell 124 as shown in the exploded view of FIG. 8. Annular outer shell 124 preferably comprises a material exhibiting desirable adhesion to interlevel dielectric layer 104. Such material includes titanium, titanium-tungsten, titanium nitride, and tungsten silicide.

Returning now to FIG. 1, the process sequence for forming contact structure 123 is shown. Semiconductor wafer 90, which includes semiconductor substrate 100, first conductive layer 102 formed on an upper surface of substrate 100, and interlevel dielectric layer 104 formed on an upper surface of first conductive layer 102, is provided.

Semiconductor substrate 100 includes a monolithic semiconductor bulk material, typically lightly doped silicon, and a plurality of transistor devices formed in the bulk material. Semiconductor substrate 100 may further include one or more insulating layers formed on the plurality of transistors and one or more conducting layers for interconnecting the plurality of transistors. In the preferred embodiment, the upper region of semiconductor substrate 100 comprises an insulating material that has been planarized to form a substantially planar surface.

First conductive layer 102 can be any conductive material suitable for semiconductor processing, such as highly doped polysilicon, aluminum, or copper. First conductive layer 102 can be formed with a variety of techniques including the chemical vapor deposition of a polysilicon layer and the physical vapor deposition or sputtering of an aluminum layer by bombarding an aluminum target with highly energetic ions. First conductive layer 102 can then be patterned with conventional photolithography and etch techniques. Interlevel dielectric layer 104 preferably comprises of a CVD oxide that has been processed with one or more planarization steps to produce a substantially planar upper surface. Alternatively, interlevel dielectric layer 104 may comprise silicon nitride, oxynitride, or a suitable combination of oxide, nitride, and oxynitride layers. Planarization of the interlevel dielectric layer can be accomplished with a chemical mechanical polish, possibly in combination with photolithography masking steps and wet or dry etching steps. As initially formed, interlevel dielectric layer 104 completely encapsulates first conductive layer 102. Tunnels or via must, therefore, be formed in interlevel dielectric layer 104 if first conductive layer 102 is to be connected to a subsequently formed conductive layer.

Figure 2:
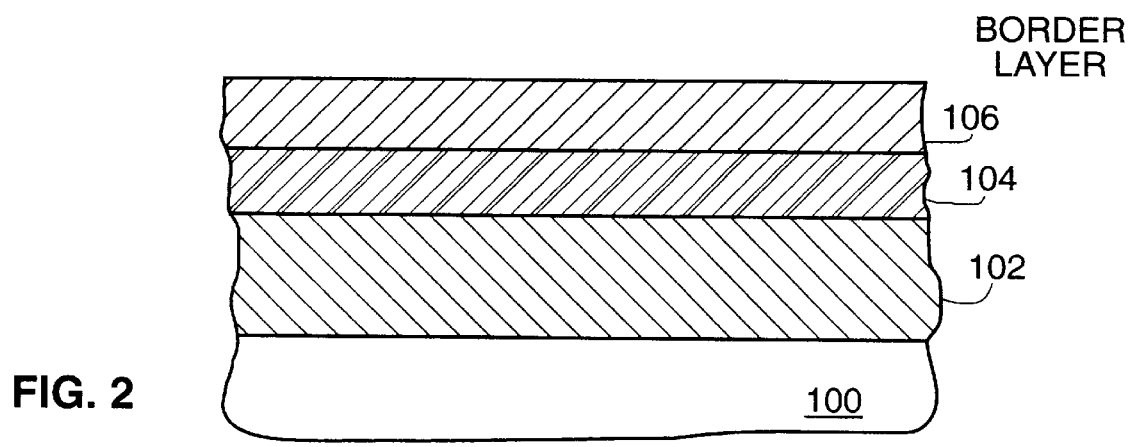
FIG. 2 depicts a processing step subsequent to FIG. 1 in which a border layer has been formed on the interlevel dielectric layer.

Turning to FIG. 2, a border layer 106 has been formed on an upper surface of interlevel dielectric layer 104. Preferably, border layer 106 is formed by chemically vapor depositing a thin film on interlevel dielectric 104 and, still more preferably, a plasma enhanced CVD process is used in which the deposition temperature is less than 350° C. Ideally, border layer 106 comprises material having a high etch selectivity with respect to interlevel dielectric layer 104. In an embodiment in which interlevel dielectric layer 104 comprises a CVD oxide, border layer 106 may suitably comprise CVD oxide, polysilicon, or silicon nitride. In a preferred embodiment, border layer 106 is a relatively thin film of approximately 50 to 150 nm.

Figure 3:
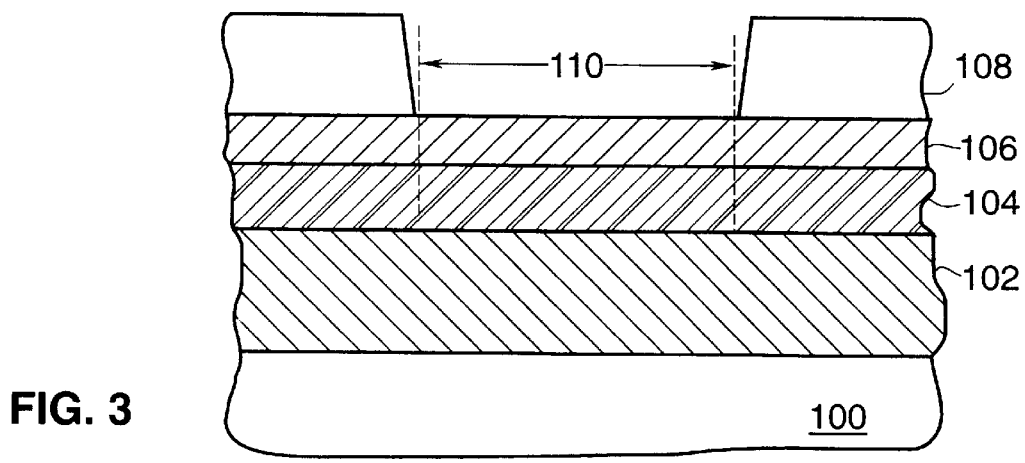
FIG. 3 depicts a processing step subsequent to FIG. 2 in which a photoresist layer has been patterned upon the border layer.
Figure 4:
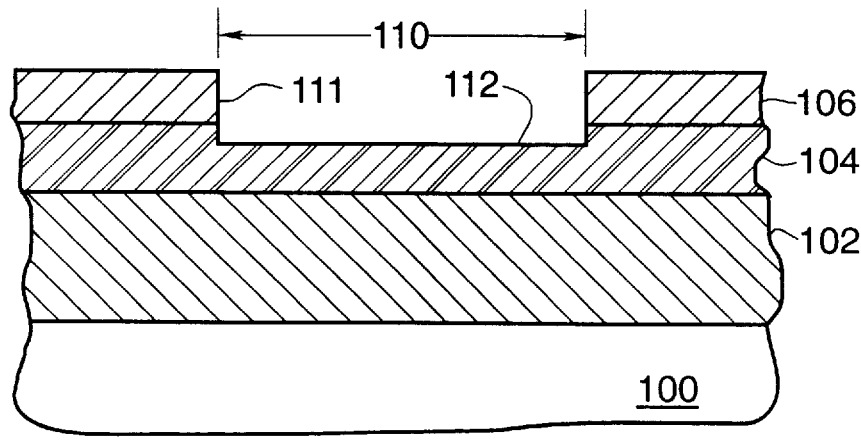
FIG. 4 depicts a processing step subsequent to FIG. 3 in which the portions of a border layer within a spacer region have been removed.

Turning now to FIGS. 3 and 4, a preferred process for selectively removing portions of border layer 106 is shown. Photoresist layer 108 is formed on an upper surface of border layer 106. A photolithography exposure apparatus and an appropriate photomask (not shown in the drawings) are provided to pattern photoresist layer 108. Patterned photoresist layer 108 exposes an upper surface of border layer 106 within spacer region 110. Preferably, the lateral dimension of spacer region 110 is approximately equal to the minimum feature size resolvable by the combination of photolithography exposure apparatus and photoresist layer 108. The portions of border layer 106 within spacer region 110 are then removed to expose an upper surface of interlevel dielectric layer 104 within spacer region 110. The removal of the portions of border layer 106 within spacer region 110 preferably results in the formation of an annular sidewall 111.

Annular sidewall 111 extends from an upper surface of interlevel dielectric layer 104 effectively bordering spacer region 110. Preferably, a plasma etch process is used to remove the portions of border layer 106 within spacer region 110. The plasma etch process can be adjusted to accommodate the particular material used to form border layer 106. The removal of portions of border layer 106 results in a topography 112 defined by upper surfaces of border layer 106 and interlevel dielectric layer 104.

Figure 5:
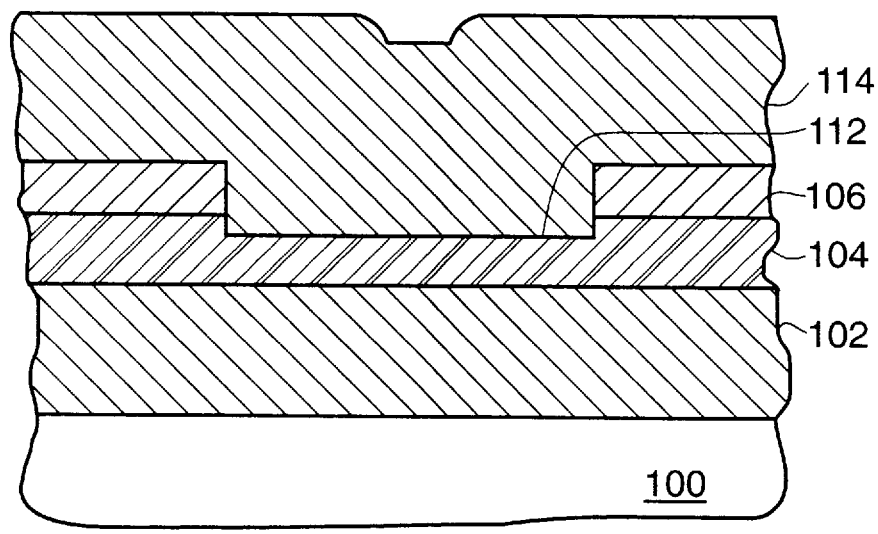
FIG. 5 depicts a processing step subsequent to FIG. 4 in which a spacer material has been formed on a topography defined by the border layer and the dielectric layer.

Turning to FIG. 5, spacer material 114 is deposited on topography 112. Preferably, spacer material 114 exhibits adequate etch selectivity with respect to both border layer 106 and interlevel dielectric layer 104. As an example, interlevel dielectric layer 104 may comprise a CVD oxide, border layer 106 may comprise silicon nitride, and spacer material 114 may comprise a CVD conductive film such as tungsten or heavily doped polysilicon. In such an embodiment, it is postulated that the conductivity of spacer material 114 may reduce the resistivity of the contact between second conductive layer 130 (shown in FIG. 9) and first conductive layer 102. In alternative embodiments, spacer material 114 could comprise oxide, undoped polysilicon, or silicon nitride depending upon the compositions of interlevel dielectric layer 104 and border layer 106. In the presently preferred embodiment, spacer material 114 is deposited on topography 112 with a conformality of approximately 80%.

Figure 10:
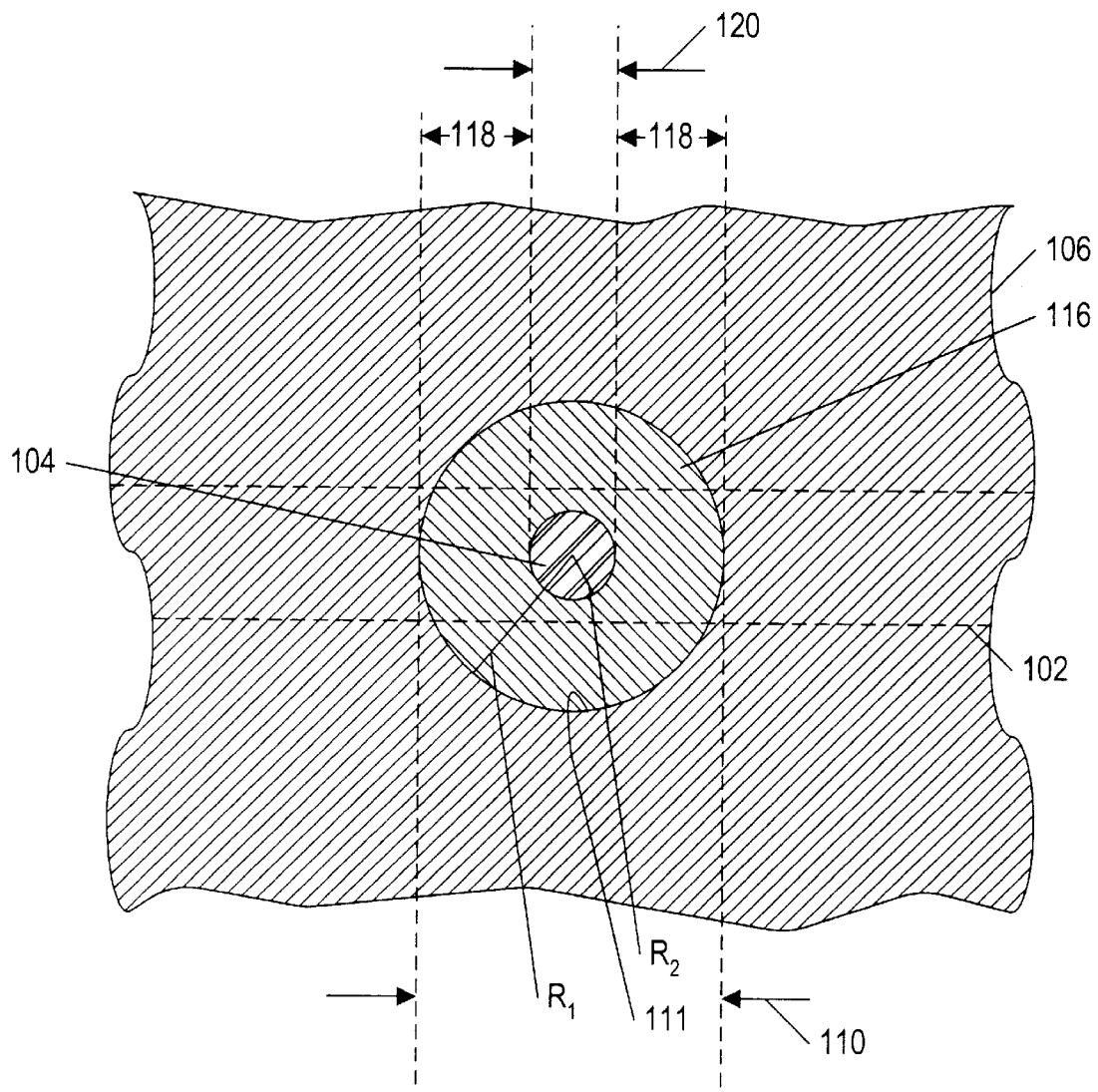
FIG. 10 is a cross-sectional view of plane A shown in FIG. 6.

Turning to FIG. 6, spacer structures 116 are formed on peripheral portions 118 of spacer region 110 by anisotropically etching spacer material 114. The spacer etch process continues until spacer material 114 is just cleared in planar regions 117 of topography 112. The formation of spacer structures such as spacer structures 116 is well known in the field of semiconductor processing and is described in, e.g., S. Wolf, *Silicon Processing for the VLSI Era Vol.* 3, pp. 595–598 (Lattice Press, Sunset Beach, Calif. 1995)(herein incorporated by reference). The spacer etch of spacer material 114 results in the formation of spacer structure 116 on peripheral portions 118 of dielectric layer 104. Spacer structure 116 extends laterally from annular sidewall 111 such that an upper surface of dielectric layer 104 within contact region 120 remains exposed. Turning briefly to FIG. 10, a cross-sectional view taken along plane A of FIG. 6 is shown. In the presently preferred embodiment depicted in FIG. 10, spacer region 110 and contact region 120 are substantially circular. Annular sidewall 111 of border layer 106 borders spacer structure 116. Spacer structure 116 covers peripheral portions 118 of spacer region 110 leaving contact region 120 exposed to dielectric layer 104. In a preferred embodiment, the lateral dimension of conductive plug 125 is approximately 100 nm, border layer 106 is approximately 50–150 nm thick, and spacer structure 116 has a lateral dimension of approximately 200 nm. The lateral dimension of the spacer structure is defined as the difference between the radius $R_1$ and the radius $R_2$ as shown in FIG. 10. The lateral dimension of spacer structure 116 can be controllably adjustable by varying the conditions under which spacer material 114 is deposited (and, to a lesser extent, by the time of the spacer etch process). The deposition pressure can be adjusted to modify the conformality of the spacer material layer 114, which in turn, modifies the post-etch lateral dimension of spacer structure 116.

Figure 9:
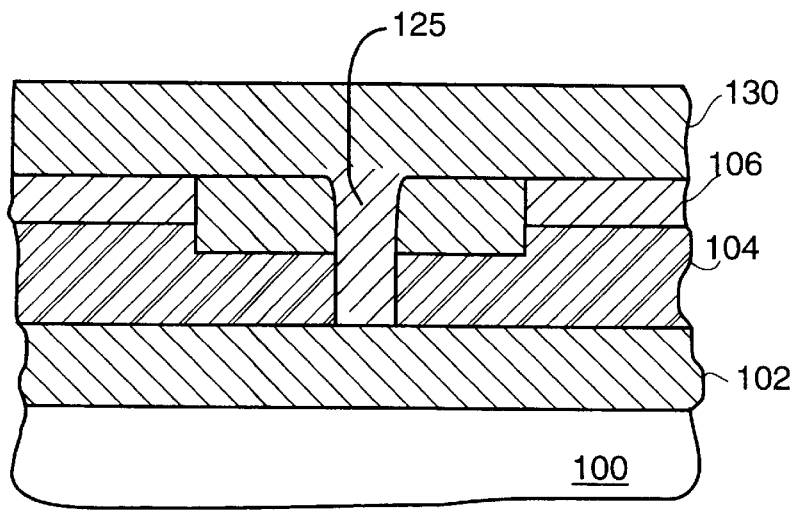
FIG. 9 depicts a processing step subsequent to FIG. 8 in which a second conductive layer has been formed on the topography defined by the border layer, the spacer structure, and an upper surface of the conductive plug.

Turning now to FIG. 7, via 122 is formed by removing the portions of dielectric layer 104 within contact region 120. Via 122 extends from an upper surface of spacer structure 116 to an upper surface of first conductive layer 102. In an embodiment in which dielectric layer 104 comprises CVD oxide, the removal of dielectric layer 104 from within contact region 120 is preferably accomplished with a plasma etch process as is well known in the art. Depending upon the composition of border layer 106, it may be necessary to precede the plasma etch process by a photoresist masking step. In particular, if the etch selectivity between interlevel dielectric 104 and border layer 106 is inadequate, it will be necessary to mask border layer 106 with photoresist prior to etch. If, for example, interlevel dielectric layer 104 and border layer 106 both comprise oxide, a photoresist mask will be required. In an embodiment in which spacer region 110 has a lateral dimension approximately equal to the minimum feature size of the photolithography exposure apparatus, the lateral dimension of contact region 120 and, correspondingly, the lateral dimension of via 122 is substantially less than the minimum feature dimension of the photolithography equipment. Turning now to FIGS. 8 and 9, a preferred embodiment for forming a conductive path to first conductive layer 102 is shown. Via 122 is filled with a conductive material to form conductive plug 125. In the presently preferred embodiment, conductive plug 125 is fabricated by blanket depositing an adhesion layer 124 (shown in the exploded view of FIG. 8). Adhesion layer 124 is used to overcome the poor adhesive characteristics of typical conductive materials used to form conductive plug 125. Adhesion layer 124 can comprise any suitable material having an adequate adhesion to dielectric layer 104. In an embodiment in which dielectric layer 104 comprises CVD oxide, for example, adhesion layer 124 may comprise titanium, titanium-tungsten, titanium nitride, titanium silicide or a combination thereof. After the blanket deposition of adhesion layer 124, conductive material such as tungsten is blanket deposited to fill via 122. The blanket deposition of the conductive materials used to form conductive plug 125 leaves conductive material in regions exterior to via 122. In a preferred embodiment, the excess conductive material is removed from regions exterior to via 122 with a planarization process, preferably a chemical-mechanical polish. The chemical mechanical process may, in addition to removing the conductive material, remove portions from the upper surfaces of border layer 106 and spacer structure 116. Turning to FIG. 9, second conductive layer 130 is formed on an upper surface of border layer 106, spacer structure 116 and conductive plug 125. Second conductive layer 130 typically comprises aluminum or copper as is well known in the field. As will be appreciated to those skilled in the art, the use of spacer structure 116 on the sidewalls 111 of a minimum feature geometry such as spacer region 110 results in a contact region 120 significantly smaller than the minimum feature resolvable by the photolithography apparatus. In an embodiment in which the photolithography apparatus comprises an I-line aligner, a lateral dimension of spacer region 110 is approximately 0.5 micron while a lateral dimension of via 122 is approximately 0.1 micron.

It will, therefore, be appreciated to those skilled in the art having the benefit of this disclosure that this invention is capable of extending the useful life of photolithography equipment by enabling a method for forming via with lateral dimensions substantially below the minimum feature size resolvable by the photolithography equipment. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process for forming an interlevel contact, comprising:

providing a semiconductor wafer comprising a semiconductor substrate, a first conductive layer deposited on an upper surface of said semiconductor substrate, and an interlevel dielectric layer formed on an upper surface of said first conductive layer;

forming a border layer on said interlevel dielectric layer;

selectively removing portions of said border layer to expose an upper surface of a spacer region of said dielectric layer and such that said border layer includes an annular sidewall extending upwards from said upper surface of said dielectric layer and encircling said spacer region;

forming a spacer structure on said annular sidewall of said border layer, wherein said spacer structure covers peripheral portions of said spacer region of said dielectric layer such that an upper surface of a contact region of said dielectric layer remains exposed, and wherein said spacer structure comprises a material etch selective to said border layer; and removing portions of said dielectric layer within said contact region such that a via is formed extending from an upper surface of said dielectric layer to an upper surface of said first conductive layer.

2. The process of claim 1 wherein the step of forming said border layer comprises chemically vapor depositing a material selected from the group consisting of oxide, polysilicon, and silicon nitride on said dielectric layer.

3. The process of claim 1 wherein the step of selectively removing portions of said border layer comprises:

depositing a photoresist layer on said border layer;

providing a photolithography exposure apparatus, wherein said photolithography exposure apparatus is capable of resolving a minimum feature dimension in said photoresist layer;

patterning said photoresist layer with said photoresist exposure device to form a patterned photoresist layer such that a spacer region of said border layer is exposed, wherein a lateral dimension of said spacer region is approximately equal to said minimum feature dimension; and removing portions of said border layer within said spacer region to expose an upper surface of said dielectric layer within said spacer region and such that said border layer includes an annular sidewall extending from said upper surface of said dielectric layer at lateral boundaries of said spacer region.

4. The process of claim 1 wherein the step of forming said spacer structure comprises:

chemically vapor depositing a spacer material on a topography defined by upper surfaces of said border layer and said interlevel dielectric layer; and anisotropically etching said spacer material to clear said spacer material from planar regions of said topography a spaced distance from the annular sidewall.

5. The process of claim 4 wherein said spacer material is conductive.

6. The process of claim 4 wherein said spacer material is selected from the group consisting of undoped polysilicon, heavily doped polysilicon, silicon nitride, and tungsten.

7. The process of claim 1 further comprising:

blanket depositing an adhesion layer;

blanket depositing a plug material selected from the group consisting of tungsten and aluminum;

removing portions of said adhesion layer and said plug material from regions exterior to said via; and forming a second conductive layer on a topography defined by upper surfaces of said border layer, said spacer structure, and said plug material.

8. A semiconductor process for forming a via comprising:

providing a semiconductor wafer, wherein said semiconductor wafer includes a semiconductor substrate, a first conductive layer formed on an upper surface of said semiconductor substrate, and an interlevel dielectric layer deposited on said first conductive layer;

forming a border layer on said interlevel dielectric layer;

depositing a photoresist layer on said border layer;

providing a photolithography exposure apparatus, wherein said photolithography exposure apparatus is capable of resolving a minimum feature dimension in said photoresist layer;

patterning said photoresist layer with said photolithography exposure apparatus to form a patterned photoresist layer such that a spacer region of said border layer is exposed, wherein a lateral dimension of said spacer region is approximately equal to said minimum feature dimension;

removing portions of said border layer within said spacer region to expose an upper surface of said dielectric layer within said spacer region and such that said border layer includes an annular sidewall extending from said upper surface of said dielectric layer at lateral boundaries of said spacer region:

forming a spacer structure on said annular sidewall of said border layer, wherein said spacer structure covers peripheral portions of said spacer region of said dielectric layer such that an upper surface of a contact region of said dielectric layer remains exposed, said contact region having a lateral dimension less than said minimum feature dimension, and wherein said spacer structure comprises a material etch selective to said border layer; and removing the portion of said dielectric layer within said contact region such that a via having a lateral dimension less than said minimum feature size and extending from an upper surface of said dielectric layer to an upper surface of said first conductive layer is formed.

9. The process of claim 8 wherein the step of forming said border layer comprises chemically vapor depositing a material selected from the group consisting of oxide, polysilicon, and silicon nitride.

10. The process of claim 8 wherein said photolithography exposure device comprises an I-line aligner.

11. The process of claim 8 wherein said minimum feature dimension of said photolithography exposure apparatus in said photoresist layer is approximately 0.5 microns.

12. The process of claim 8 wherein the step of forming said spacer structure comprises:

chemically vapor depositing a spacer material on a topography cooperatively defined by upper surfaces of said border layer and said dielectric layer; and anisotropically etching said spacer material to just clear said spacer material in planar regions of said topography.

13. The process of claim 12 wherein said spacer material is conductive.

14. The process of claim 12 wherein said spacer material is selected from the group consisting of oxide, undoped polysilicon, heavily doped polysilicon, silicon nitride, and tungsten.

15. The process of claim 8 further comprising:

blanket depositing an adhesion layer;

blanket depositing a plug material selected from the group consisting of tungsten and aluminum;

removing portions of said adhesion layer and said plug material from regions exterior to said via; and forming a second conductive layer on a topography defined by upper surfaces of said border layer, said spacer structure, and said plug material.

* * * * *